(12) United States Patent
Tyveleijn

(10) Patent No.: US 6,328,296 B2
(45) Date of Patent: Dec. 11, 2001

(54) HOLDER FOR A SEMICONDUCTOR SUBSTRATE, AND METHOD OF MANUFACTURING A SEMICONDUCTOR DEVICE USING SUCH A HOLDER

(75) Inventor: Johannes H. Tyveleijn, Stadskanaal (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/164,691

(22) Filed: Oct. 1, 1998

(30) Foreign Application Priority Data

Oct. 3, 1997 (EP) .................................................. 97203073

(51) Int. Cl.$^7$ ...................................................... B23Q 3/00
(52) U.S. Cl. ........................ 269/297; 269/903; 269/902; 269/287
(58) Field of Search ............................. 269/47, 53, 54.1, 269/87.3, 903, 900, 902, 287, 297; 451/364, 378, 385; 157/16

(56) References Cited

U.S. PATENT DOCUMENTS

| 4,793,603 | * 12/1988 | Wober .............................. 269/254 R |
| 4,854,568 | * 8/1989 | Baeza et al. ........................ 269/268 |
| 4,971,676 | * 11/1990 | Doue et al. ....................... 269/289 R |
| 5,352,249 | * 10/1994 | Vollaro ................................. 269/903 |
| 5,700,297 | * 12/1997 | Vollaro ................................. 269/305 |
| 5,961,107 | * 10/1999 | Vollaro ................................. 269/305 |
| 6,062,289 | * 5/2000 | Cunningham et al. ................. 157/16 |

FOREIGN PATENT DOCUMENTS 58155736A    9/1983    (JP) ....................................................
61220351A    9/1986    (JP) ....................................................

* cited by examiner

Primary Examiner—Joseph J. Hail, III
Assistant Examiner—Lee Wilson
(74) Attorney, Agent, or Firm—Steven R. Biren

(57) ABSTRACT

The invention relates to a holder for a semiconductor substrate including a main body which is provided with three or more projections by means of which the substrate can be held fixed in the holder. Two projections are fixedly connected, and a third projection present opposite the other two is movably connected to the main body. The third projection can be moved away from the other two and is urged towards the latter two by means. According to the invention, a lateral side of each projection facing towards the substrate to be inserted is provided with a convex recess whose geometry is such that exclusively the outermost edges of both the upper surface and the lower surface of the substrate to be inserted come into contact with the convex recess. A substrate, for example a round substrate, can be satisfactorily fastened in such a holder while still its entire surface area can be processed. Given a suitable placement of the projections, fluctuations in diameter and thickness of the substrate to be inserted are compensated for. The projections have a diabolo shape in a preferred embodiment. The accessibility of the substrate is substantially optimized by this. In addition, such a holder can be simply and inexpensively manufactured. A holder according to the invention is particularly suitable for treatments of the semiconductor substrate as part of the manufacture of semiconductor devices such as diodes, in particular in steps such as the provision or removal of a (semi)conducting or insulating layer.

10 Claims, 1 Drawing Sheet

HOLDER FOR A SEMICONDUCTOR SUBSTRATE, AND METHOD OF MANUFACTURING A SEMICONDUCTOR DEVICE USING SUCH A HOLDER

BACKGROUND OF THE INVENTION

The invention relates to a holder for a semiconductor substrate, often referred to as substrate hereinafter for short, comprising a main body which is provided with three or more projections between which the substrate can be fixed in the holder and of which at least a first and a second projection are fixedly connected to the main body, while a third projection which is present opposite the first and the second projection is movably connected to the holder and can be moved in a direction away from the first and the second projection, while the holder is provided with means by which the third projection is urged towards the first and the second projection. The invention also relates to a method of manufacturing a semiconductor device in which such a holder is used.

Such a holder, fitted with a substrate which is usually round, is used for providing the surface of this substrate with a (semi)conducting or insulating region or for removing such a region. To achieve this, the holder is usually placed in a device in which gases or liquids are present by means of which the above operation can be carried out. The holder may also form part of said device.

Such a holder is known from a U.S. patent document published under U.S. Pat. No. 4,971,676 on Nov. 20, 1990. The holder shown in FIG. 1 thereof comprises a main body in the form of a flat carrier plate which is provided with four projections arranged in a circle by means of which the substrate can be fixed in the holder. Three of the projections each comprise a cylinder segment which lies in a different quadrant of the carrier plate each time and whose upper side is covered with a plate in the form of a circle sector which extends over the substrate to be inserted and over the carrier plate. A fourth projection is present in a fourth quadrant, has the shape of a cylinder, and is capable of movement in a direction away from the other projections and is urged towards the fixed projections - and thus towards the substrate to be inserted - by means of a spring. The fourth projection can be recessed into the carrier plate, so that the substrate can be passed over the carrier plate to below the other three projections.

It is a disadvantage of the known holder that it covers part of the substrate. As a result of this, the substrate is not exposed in its entirety to the materials with which the surface of the substrate is treated during a processing operation on the substrate. Moreover, the known holder is comparatively expensive owing to its complexity.

SUMMARY OF THE INVENTION

It is an object of the present invention to provide a holder for a substrate which does not have the above disadvantage, which renders it possible to process a portion of the substrate present in the holder which is as large as possible, and which is at the same time simple and inexpensive.

According to the invention, a holder of the kind mentioned in the opening paragraph is for this purpose characterized in that a lateral side of each projection facing towards the substrate to be inserted is provided with a concave recess whose geometry is such that exclusively the outermost edges of the both the upper surface and the lower surface of the substrate to be inserted come into contact therewith. The concave shape of the recess in the portion of a projection facing the substrate achieves that a substrate can be clamped in securely and fixedly in the holder. The entire surface area - both the upper surface and the lower surface - of the substrate is accessible to those substances with which a treatment of the substrate is carried out thanks to a suitable choice of the geometry of the concave recess, which is such that the substrate is in contact with the recess only at the edges of both the upper surface and the lower surface of the substrate. The portion of the projection comprising the concave recess does cause some shadow effect, but this is considerably less than in the known holder thanks to the invention. A very suitable shape for the recess is, for example, the shape of a triangle or a trapezium (=truncated triangle). Preferably, the recess has a cross-section in radial direction which is triangular. The advantages of this will be explained further below. The shadow effect is still further reduced by a suitable choice of the three-dimensional shape of the projection, which will also be discussed further below.

In a preferred embodiment of a holder according to the invention, the first and the second projection lie within two mutually adjoining quadrants of the main body, when viewed in projection, and the third projection lies outside said quadrants, when viewed in projection, and preferably at a distance to the first and the second projection which is as great as possible. A holder suitable for, for example, round substrates, can accommodate a spread in the diameters of these substrates as a result of this placement of the projections. That is to say, substrates having a diameter which is somewhat smaller or somewhat greater than the nominal diameter can still be well retained in the holder. An important advantage of the present invention is a spread in the thickness of the substrates can also be accommodated in such a placement, thanks to the concave recess and the manner in which this makes contact with the substrate. Thus substrate having a thickness greater or smaller than the nominal thickness can still be satisfactorily clamped in in the holder. Preferably, the holder.comprises a total of exactly three projections which are present approximately in the corner points of an equilateral triangle. Such a holder is particularly suitable for round substrates.

In a very important and advantageous modification of a holder according to the invention, the projections each have the shape of a diabolo. This means that a substrate to be placed in the holder makes contact with a projection in one point only at the edge of its upper surface and in one point only at the edge of its lower surface. The already comparatively small shadow effect of the projections in a holder according to the invention is considerably reduced thereby. This shape, where the recess has the shape of a triangle or trapezium, also provides an excellent contribution to the accommodation of fluctuations in thickness and diameter of the substrate.

Preferably, the shape of the projections is that of a diabolo which comprises two truncated cones placed on top of one another. So this is a diabolo which does not have a cylindrical central portion, unlike, for example, a yarn reel. The recess is triangular in shape then. The advantage of such a diabolo shape may be elucidated as follows. It is favorable to choose the apex angle of at least the upper cone of the diabolo to be as small as possible in order to achieve a minimum shadow effect. If the diabolo has no cylindrical central portion in that case, it is easier to achieve, also in the case of a thin substrate, that the latter will make contact with the projection at the edges only. It is favorable in practice to choose different values for the apex angles of the two cones of the diabolo. The cone which is present above the substrate and which causes the shadow effect mentioned above is preferably given an apex angle which is as small as possible, for example an apex angle of between 36 and 44°, and preferably approximately 40°. A somewhat greater apex angle is preferably chosen for the cone which lies below the substrate. A substrate placed in the holder is moved more easily into its end position as a result of this, which is movement involves a displacement over the slope formed by the lower cone. A suitable apex angle for this lies between 116 and 124° and is preferably approximately 120°. The height of the upper cone 31 is chosen to be as possible, again to reduce the shadow effect.

An important additional advantage of a holder according to the invention is that a substrate placed in the holder will always lie parallel to the main body, provided the projections have the same dimensions. This also contributes to the homogeneity of a result of a treatment carried out on the substrate. A further important advantage of the diabolo shape is that the projection having this shape is not only easy to manufacture but is also readily fastened on the main body of the holder. Finally, it is an important advantage of a holder according to the invention that a substrate can also be easily placed therein from above. The comparatively complicated recessing of the movable projection into the known holder may thus be omitted.

Preferably, the third projection is provided with a pin by means of which this projection can be readily displaced in outward direction with a hand or a finger. Furthermore, the means by which the third projection is urged towards the first and the second projection is preferably a spring fastened to the main body and to the third projection. In a very favorable modification, the first and the second projection are connected to the main body by means of a rivet joint. All components of the holder are preferably manufactured from stainless steel. The holder can thus be manufactured in a simple and inexpensive manner. The holder is highly suitable for many applications, in particular those in which a layer is deposited on the substrate at an elevated temperature.

The invention accordingly also relates to a method of manufacturing a semiconductor device whereby the surface of a substrate is provided with a conducting, semiconducting, or insulating region, or is divested of such a region, and whereby the substrate is fastened in a holder for the purpose of providing or removing said region, characterized in that a holder according to the invention is used for fastening the substrate. In a preferred embodiment of a method according to the invention, the substances by means of which the region is removed or provided are supplied from the liquid phase or from the gas phase. The holder may be a loose holder which is placed in a device in which the treatment of the substrate is carried out. Alternatively, the holder may form part of such a device. Semiconductor devices manufactured by such a method have homogeneous properties irrespective of the question from which portion of the substrate the semiconductor device is formed.

BRIEF DESCRIPTION OF THE DRAWINGS

The invention will now be explained in more detail with reference to an embodiment and the accompanying drawing, in which FIG. 1 diagrammatically shows an embodiment of a holder for a semiconductor substrate according to the invention, partly in cross-section and partly in side elevation, and FIG. 2 diagrammatically shows the holder of FIG. 1 in plan view.

The Figures are not drawn true to scale, the dimensions in the thickness direction being particularly exaggerated for greater clarity. Corresponding regions have been given the same hatching and the same reference numerals as much as possible.

DESCRIPTION OF THE PREFERRED EMBODIMENTS

Figure 1:
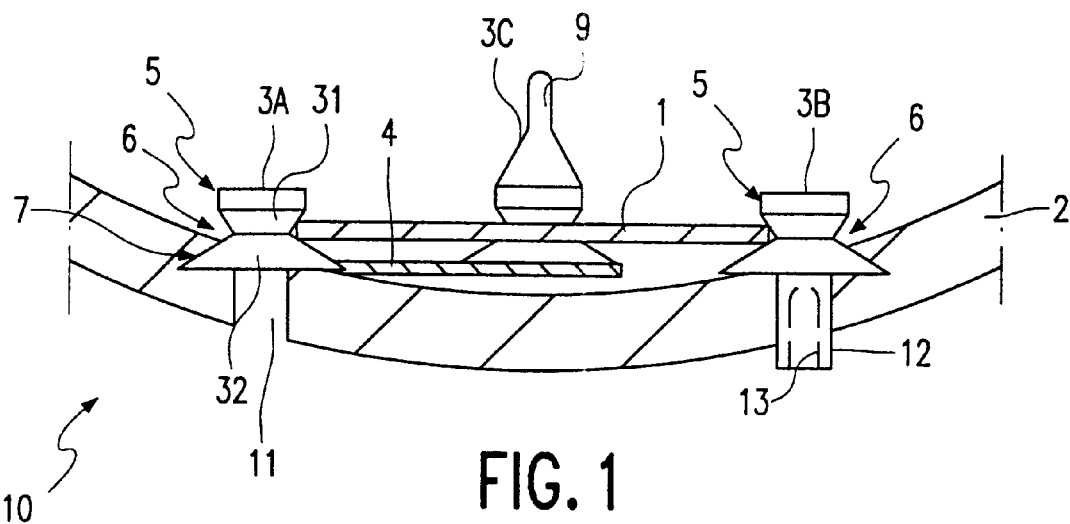
Figure 2:
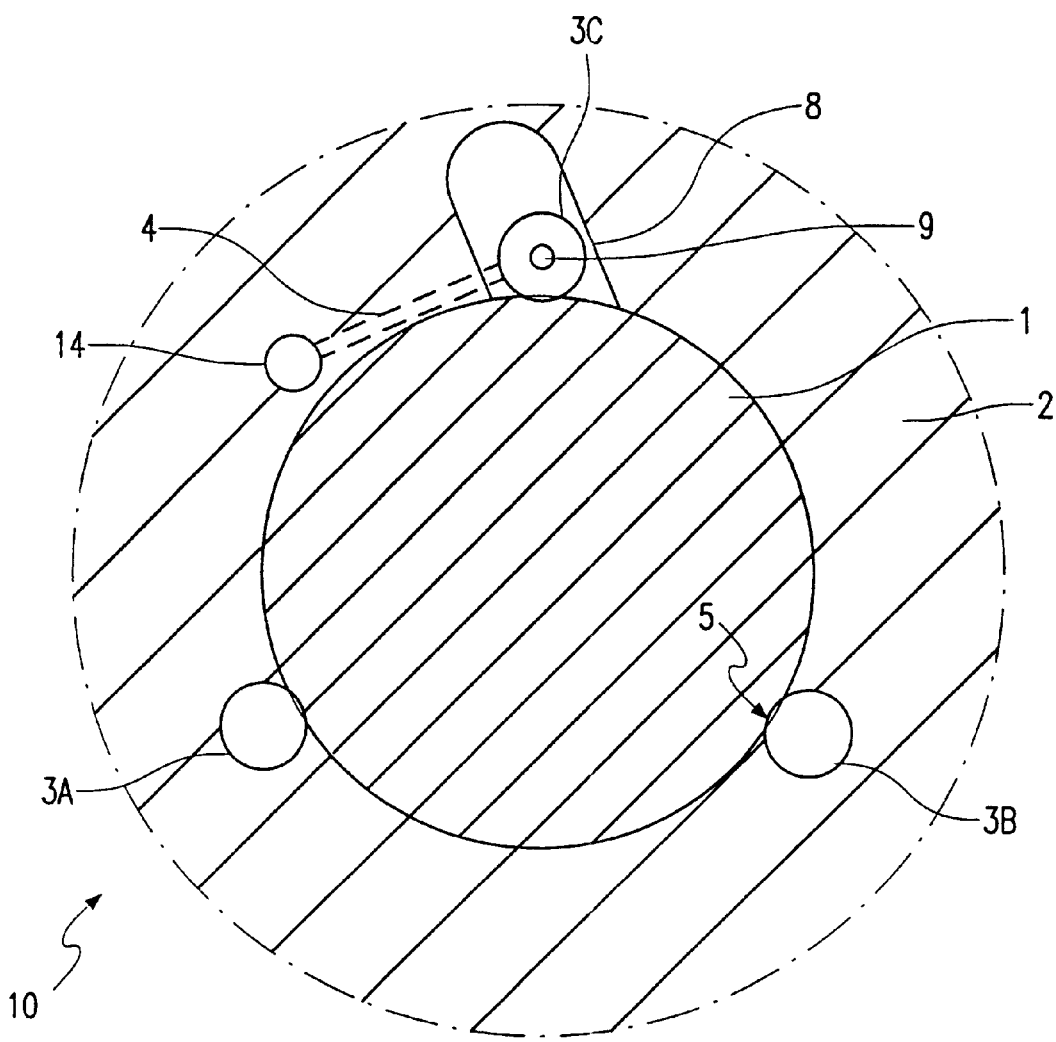

FIG. 1 shows an embodiment of a holder for a semiconductor substrate according to the invention diagrammatically, partly in cross-section and partly in side elevation. A plan view of the holder of FIG. 1 is shown in FIG. 2. The holder 10 in this example comprises a main body 2, which here comprises a curved plate 2 which is only partly depicted in the Figure and which here forms part of a vapor deposition device which is not shown in the Figures. The plate 2 is provided with three or more, in this case exactly three projections 3 by means of which a substrate 1 is held fixed in the holder 10. At least a first and a second projection 3, in this case exactly two projections 3A, 3B, are fixedly connected to the plate 2. At least one, in this case exactly one, third projection 3C is movably connected to the main body 2, lies opposite the first and the second projection 3A, 3B, and is capable of being moved away therefrom. The holder 10 is provided with means 4 by which the third projection 3C can be urged towards the first and the second projection 3A, 3B.

According to the invention, a lateral side 5 of each projection 3 facing towards the substrate 1 is provided with a concave recess 6 whose geometry is such that exclusively the outer edges of both the upper surface and the lower surface of the substrate 1 come into contact therewith. This has the result on the one hand that the substrate 1 can be securely fastened in the holder 10, while on the other hand this fastening leaves the entire upper surface (and lower surface) of the substrate 1 exposed. As a result, the entire surface area of the substrate 1 is accessible to substances by means of which a treatment of the substrate 1, in this example the deposition of a layer of aluminum on the substrate 1, is carried out. A particularly suitable shape for the recess 6 is that of a triangle 6, preferably not truncated, as will become apparent further below. Some shadow effect owing to the projection 3 is indeed still present, but it is considerably less than in the known holder.

The projections 3 in the present example have the shape of a diabolo 3. Thanks to this shape, the shadow effect of the projections 3 mentioned above is further reduced. No more than a single point lying on the upper edge and one on the lower edge of the substrate 1 make contact with the recess 6 as a result of this shape. The first and the second diabolo-shaped projections 3A, 3B lie within two mutually adjoining quadrants, when viewed in projection. The third diabolo-shaped projection 3C is present outside said quadrant and occupies a symmetrical position with respect to the first and the second projection 3A, 3B. In this example, the three projections 3 lie approximately in the corner points of an equilateral triangle.

The diabolo-shaped projections 3 here each comprise two truncated cones 31, 32 placed on one another. The upper cone 31 here has a smaller apex angle than the lower cone 32. Thanks to the steepness of the upper cone 31, the shadow effect of the positions 3 mentioned above is practically nil, or at least very substantially reduced. Thanks to the comparatively gentle slope of the lower cone 32, the substrate 1, when placed in the holder, is automatically driven into its final position by the pushing force of the third projection 3C directed towards the two other projections 3A, 3B. Said apex angles in this example are 40 and 120°, respectively, but they may be advantageously chosen to lie between 36 and 44° and between 116 and 124°, respectively. The projections 3 are in addition easy to manufacture in this manner. It is also easy to fasten the projections 3 to the plate 2, by means of rivet joints in this case. The plate 2 in this example is for this purpose provided with openings 11 through which respective hollow pins 12 are passed, which pins form part of the projections 3. The rivet joint between a projection 3 and the plate 2 is created in that a conical rod 13 is driven with force into the hollow pin 12. The openings 11 in the plate 2 issue into a cylindrical recess 7, in which the lower cone 32 is accomodated, at the upper side of the plate 2. This lower cone is accordingly recessed into the plate 2 for a small portion. This further facilitates the automatic displacement of the substrate 1 into its final position as mentioned above.

A further advantage of the holder 10 in this example is that the substrate 1 will arrive in a very well defined horizontal position after its fastening in the holder 10. This also benefits the homogeneity of the result of a treatment carried out on the substrate 1. Important advantages, furthermore, are that minor variations in both the diameter and the thickness of the substrate 1 do not adversely affect a satisfactory fastening in the holder 10. The dimensions of the holder 10 in this example are as follows. The projection 3 are at a mutual distance of 9.5 cm, so that the holder is suitable for accommodating a substrate 1 having a diameter of 4". The nominal thickness of the substrate 1 is 0.3 mm. The projections 3 have a height of 2.5 mm and the cones 31, 32 are 0.8 and 1.0 mm high, respectively, have a greatest diameter of 4 and 6.8 mm, respectively, and have a smallest diameter of 3.4 mm in both cases. On top of the upper cone 31 of each fixed projection 3A, 3B there is a 0.6 mm high cylindrical portion, whereby a sharp edge at the upper side of these projections 3A, 3B is avoided.

The third projection 3C in this embodiment is provided with a pin 9 at its upper side, so that this projection 3C can be easily moved away from the other ones with a hand or a finger. The plate 2 is provided with an opening 8 for this purpose. The means 4 by which the third projection 3C is urged towards the first and the second projection 3A, 3B here comprise a spring 4. The spring 4 is connected to the plate 2 by means of a pin 14 and to the third projection 3C. In the present example, all components of the holder 10, i.e. the plate 2, the projections 3, the spring 4, and the pin 14 are manufactured from stainless steel. Not only is the holder 10 inexpensive as a result of this, but it is also particularly suitable for operations on the substrate which are carried out at an elevated temperature.

The holder 10 of the present example is used in the manufacture of a semiconductor device, when a conductive region is provided on the surface of the semiconductor substrate 1 (which comprises a pn junction), an aluminum layer in this case. To provide the aluminum layer, the substrate 1 is placed in the present embodiment of the holder 10. The aluminun layer provided acts as a contact for diodes to be formed from the substrate and is provided by means of vapor deposition at a temperature of 300° C. The entire surface of the substrate 1 is evenly coated thereby thanks to the holder 10 according to the invention. This strongly benefits the yield and homogeneity of the semiconductor devices manufactured, diodes in this case.

The invention is not limited to the embodiment described since many modifications and variations are possible to those skilled in the art within the scope of the invention. Thus the dimensions of the holder and of the components thereof may be differently chosen with a view to a different standard diameter of the substrate. The holder may also be made from alternative materials such as teflon, which renders the holder more suitable for other treatments of the substrate than the vapor deposition of a layer, such as chemical etching which often takes place at low temperatures. Said treatments are not limited to those usual in the manufacture of discrete components, indeed, the holder may be used to advantage in the manufacture of ICs (=integrated circuits).

The carrier plate may also comprise several sets of projections so that the holder can accommodate several substrates at the same time. It is also possible to render the holder suitable for treatments of both sides of the substrate placed therein and to provide it, for example, with a mechanism for turning the holder over through 180°, so that the upper side and lower side of the substrate are interchanged. In that case, a symmetrical shape of the projections in axial direction is more advantageous.

Compressed air may alternatively be used as a pressure means for the movable projection. This is also true for the displacement of this projection. This facilitates an automated remote control of the holder.

The invention is not limited to holders having three projections. It is possible to increase both the number of fixed projections and the number of movable projections, as desired. The additional projections should be suitably positioned, for example on the circumference of a circle in the case of round substrates. A specially adapted placement, however, is quite possible for rectangular substrates such as those which are still occasionally used, for example, for III–V semiconductor substrates.

What is claimed is:

1. A holder for a flat semiconductor substrate comprising a main body which is provided with at least three projections for fixing the flat semiconductor substrate in the holder and of which at least a first and a second projection are fixedly connected to the main body, while a third projection which is present opposite the first and the second projection is movably connected to the holder and is movable in a direction away from the first and the second projection, while the holder is provided with means by which the third projection is urged towards the first and the second projection, characterized in that a lateral side of each projection facing towards the flat semiconductor substrate to be inserted is provided with a concave recess whose geometry is such that exclusively the outermost edges of the both the upper surface and the lower surface of the flat semiconductor substrate to be inserted come into contact with said concave recess.

2. A holder as claimed in claim 1, characterized in that the recess has the shape of a triangle, seen in cross-section.

3. A holder as claimed in claim 1, characterized in that the projections have the shape of a diabolo, preferably a diabolo which has the shape of two truncated cones placed on one another.

4. A holder as claimed in claim 3, characterized in that the upper cone of each diabolo-shaped projection has a smaller apex angle than the lower cone.

5. A holder as claimed in claim 3, characterized in that the apex angle of the upper cone of each diabolo-shaped projection lies between 36 and 44°, and is preferably approximately 40°, and in that the apex angle of the lower cone lies between 116 and 124° and is preferably approximately 120°.

6. A holder as claimed in claim 1, characterized in that the first and the second projection lie within two mutually adjoining quadrants of the main body, when viewed in projection, and the third projection lies outside said quadrants, when viewed in projection, and preferably at a distance to the first and the second projection which is as great as possible.

7. A holder as claimed in claim 1, characterized in that the holder comprises exactly three projections which are present approximately in the corner points of an equilateral triangle.

8. A holder as claimed in claim 1, characterized in that the third projection is provided with a pin, in that the means by which the third projection is urged towards the first and the second projection comprise a spring fastened to the main body and to the third projection, in that the first and the second projection are each connected to the main body by means of a rivet joint, and in that all components of the holder are made from stainless steel.

9. A holder as claimed in claim 1, characterized in that the recess has the shape of a trapezium, seen in cross-section.

10. A holder as claimed in claim 1, characterized in that the third projection is provided with a pin, in that the means by which the third projection is urged towards the first and the second projection comprise a leaf-spring fastened to the main body and to the third projection.

* * * * *